United States Patent
Wang et al.

(10) Patent No.: US 7,629,236 B2
(45) Date of Patent: Dec. 8, 2009

(54) METHOD FOR PASSIVATING CRYSTAL SILICON SURFACES

(75) Inventors: Qi Wang, Littleton, CO (US); Tihu Wang, Littleton, CO (US); Matthew R. Page, Littleton, CO (US); Yanfa Yan, Littleton, CO (US)

(73) Assignee: Alliance For Sustainable Energy, LLC, Golden, CO (US)

( * ) Notice: Subject to any disclaimer, the term of this patent is extended or adjusted under 35 U.S.C. 154(b) by 461 days.

(21) Appl. No.: 11/574,167

(22) PCT Filed: Aug. 26, 2004

(86) PCT No.: PCT/US2004/027728

§ 371 (c)(1),
(2), (4) Date: Feb. 23, 2007

(87) PCT Pub. No.: WO2006/025820

PCT Pub. Date: Mar. 9, 2006

(65) Prior Publication Data

US 2008/0092951 A1    Apr. 24, 2008

(51) Int. Cl.
*H01L 21/36* (2006.01)
*H01L 21/20* (2006.01)

(52) U.S. Cl. .................. 438/488; 136/249; 136/261; 427/74; 427/255.393; 427/255.394; 438/57; 438/482; 438/490; 438/492; 438/503

(58) Field of Classification Search .................. 136/249, 136/261; 427/74, 255.27, 255.393, 255.394; 438/57, 482, 488, 490, 492, 503, 507, 769, 438/775
See application file for complete search history.

(56) References Cited

U.S. PATENT DOCUMENTS

| | | | |
|---|---|---|---|
| 5,903,047 A | 5/1999 | Liao et al. | |
| 6,734,037 B1 * | 5/2004 | Fath et al. | ..................... 438/57 |
| 6,746,709 B2 | 6/2004 | Lauinger et al. | |
| 2004/0112426 A1 | 6/2004 | Hagino | |

FOREIGN PATENT DOCUMENTS

JP            60136259 A         7/1985

* cited by examiner

*Primary Examiner*—Asok K Sarkar
(74) *Attorney, Agent, or Firm*—Paul J. White; Mark D. Trenner; John C. Stolpa (57) ABSTRACT

In a method of making a c-Si-based cell or a μc-Si-based cell, the improvement of increasing the minority charge carrier's lifetime, comprising: a) placing a c-Si or polysilicon wafer into CVD reaction chamber under a low vacuum condition and subjecting the substrate of the wafer to heating; and b) passing mixing gases comprising $NH_3/H_2$ through the reaction chamber at a low vacuum pressure for a sufficient time and at a sufficient flow rate to enable growth of an a-Si:H layer sufficient to increase the lifetime of the c-Si or polysilicon cell beyond that of the growth of an a-Si:H layer without treatment of the wafer with $NH_3/H_2$.

12 Claims, 7 Drawing Sheets

METHOD FOR PASSIVATING CRYSTAL SILICON SURFACES

CONTRACTURAL ORGIN OF THE INVENTION

The United States Government has rights in this invention under Contract No. DE-AC3699GO10093 between the United States Department of Energy and the National Renewable Energy Laboratory, a division of the Midwest Research Institute.

TECHNICAL FIELD

The present invention relates to a method for passivating crystal silicon surfaces such as those used in c-Si-based solar cells prior to deposition of a thin a-Si:H layer to improve the minority charge carrier's lifetime and passivating μc-Si devices before growing doped layers to enhance lifetime performance.

BACKGROUND ART

Common methods of surface passivation techniques include $SiO_2$, $SiN_x$, $SiO_2/SiN_x$ stack, and a-Si:H formed by: plasma enhanced chemical vapor deposition (PECVD); and hot wire chemical vapor deposition (HWCVD).

U.S. Pat. No. 5,580,828 disclose a method of chemical surface passivation by using a solution of iodine and ethanol, a solution of concentrated alkaline such a ammonia, sodium and potassium-hydroxide for n-type specimens, or, for either type specimens, and a solution of HF at about 40% m/m so as to reduce surface recombination velocities to 10 cm/second or less.

A low temperature composite passivation film is deposited over a semiconductor device at temperatures <150° C. in U.S. Pat. No. 5,903,047 by first forming a hydrogenated amorphous silicon nitride ($a-SiN_x:H$) film over the semiconductor device and then forming a very thin layer (>6.4 nm) of an amorphous silicon hydride (a-Si:H) film over the $a-SiN_x:H$ film to prevent oxidation of the semiconductor device due to percolation of moisture, and maintain the electric properties and stability of the semiconductor device.

U.S. Pat. No. 5,507,880 disclose a solar module comprising a glass substrate having thereon:

(a) a conductive metal oxide layer;
(b) an amorphous semiconductor layer;
(c) a back metal electrode; and
(d) a passivating resin layer, wherein the passivating resin layer comprises a hydrocarbon-based water vapor barrier layer having a permeability to water vapor of not more than 1 g/m² day measured at a thickness of 100 μm, and wherein the water vapor barrier layer comprises a polymer selected from the group consisting of polyisobutylene, polyisoprene, modified polyisoprene, polybutene, polybutadiene, and modified polybutadiene.

There is a need in the art of preparing crystal silicon surfaces to provide good surface passivation since the direct growth of a-Si:H on c-Si does not generally produce good surface passivation.

DISCLOSURE OF THE INVENTION

One object of the present invention is to provide a method for producing good surface passivation when depositing a-Si:H on crystal silicon (c-Si).

Another object of the present invention is to provide a method for producing good surface passivation when depositing a-Si:H on c-Si by surface treatment with a mixture of $NH_3/H_2$ prior to application and growth of a-Si:H.

A further object of the present invention is to provide a method for producing good surface passivation when depositing a-Si:H on c-Si without incurring growth of an intermediate epi-Si layer by surface treatment of c-Si with a mixture of $NH_3/H_2$ prior to application and growth of a-Si:H.

In general, the method of the invention is accomplished by placing a c-Si wafer or solar cell into a CVD chamber which is pumped down to a pressure of about $10^{-6}$ Torr and heating the substrate of the wafer to about 400 μm in thickness under this low vacuum until it reaches about 250° C., whereupon the CVD method is commenced by passing mixing gases of $NH_3$ and $H_2$ through the chamber at a pressure of about 20 mTorr for sufficient time i.e., about 60 seconds to about 3 minutes, and growing a-Si:H layer using $SiH_4$ at a flow rate of about 15 sccm at about 7 mTorr for less than about 30 seconds to produce a-Si:H at about 400 Å thick—wherein the flow rate of $NH_3$ is in the range of from about 2 to about 10 sccm and the $H_2$ flow rate is in the range of from about between 0 to about 50 sccm to produce an increase in the lifetime of the c-Si wafer at least three-fold or to about 20 μs compared to a lifetime of about 6 μs for a comparable c-Si wafer prepared without this method, as, for example, using NO or $H_2$. The method is also applicable to polysilicon and μc-Si wafers.

BRIEF DESCRIPTION OF THE DRAWINGS

FIG. 5 depicts three types of c-Si based solar cell devices, utilized for effective passivation according to the invention process, wherein.

DETAILED DESCRIPTION OF PREFERRED EMBODIMENT OF INVENTION

The invention process improves the minority carrier's lifetime of c-Si based solar cells by providing a surface treatment prior to deposition of a thin a-Si:H, wherein the surface treatment is accomplished by mixing $NH_3$ and $H_2$ gases in a chemical vapor deposition (CVD) or hot wire chemical vapor deposition (HWCVD) process chamber at a low substrate temperature for a short time. TEM images hereinafter show a sharp transition (a few mono-layers) from c-Si to a-Si:H growth, whereas, without the surface treatment of the invention, the TEM shows an epi-grown layer.

In a normal hotwire CVD deposition of Si on c-Si substrates, full epitaxial growth is easily obtained unintentionally if the deposited layer is thin. This is shown in the TEM photograph of FIG. 1 where there is a HWCVD epi-Si interface or growth and in which the c-Si surfaces are not passivated well.

In regard to normal hotwire CVD deposition of Si on c-Si substrates, partial epitaxial growth may be expected if the deposited layer is thick (i.e., beyond 20 nm); however, this results in a rough interface between the a-Si and the c-Si substrate or phase, as well as strains and defects between the c-Si substrate and the newly deposited layer.

Figure 2:
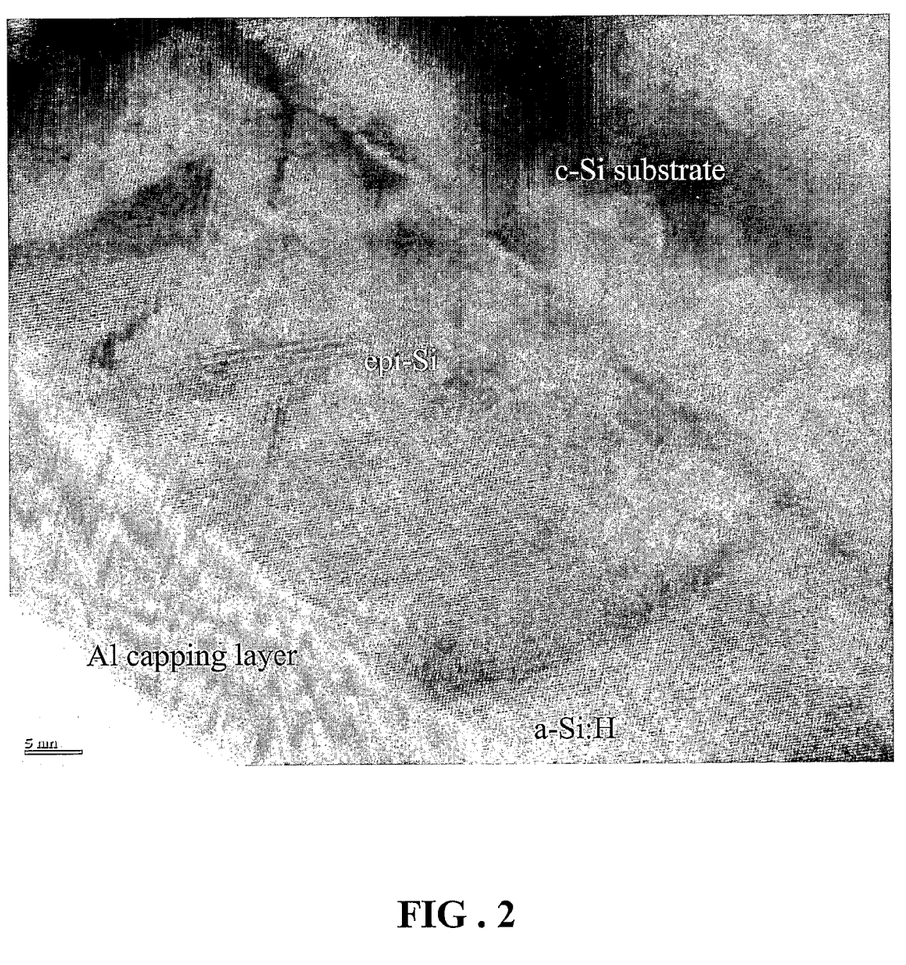
FIG. 2 is a TEM picture showing a normal hot wire chemical vapor deposition (HWCVD) of Si on a c-Si substrate, wherein partial epitaxial growth is produced if the deposited layer is greater in thickness than 20 nm—thereby resulting in a rough interface between a-Si and the c-Si substrate or phase, as well as strains and defects between the c-Si substrate and the newly deposited layer.

FIG. 2 is a TEM picture showing a normal hot wire chemical vapor deposition (HWCVD) of Si on a c-Si substrate, wherein partial epitaxial growth is produced if the deposited layer is greater in thickness than 20 nm—thereby resulting in a rough interface between a-Si and the c-Si substrate or phase, as well as strains and defects between the c-Si substrate and the newly deposited layer.

Figure 3:
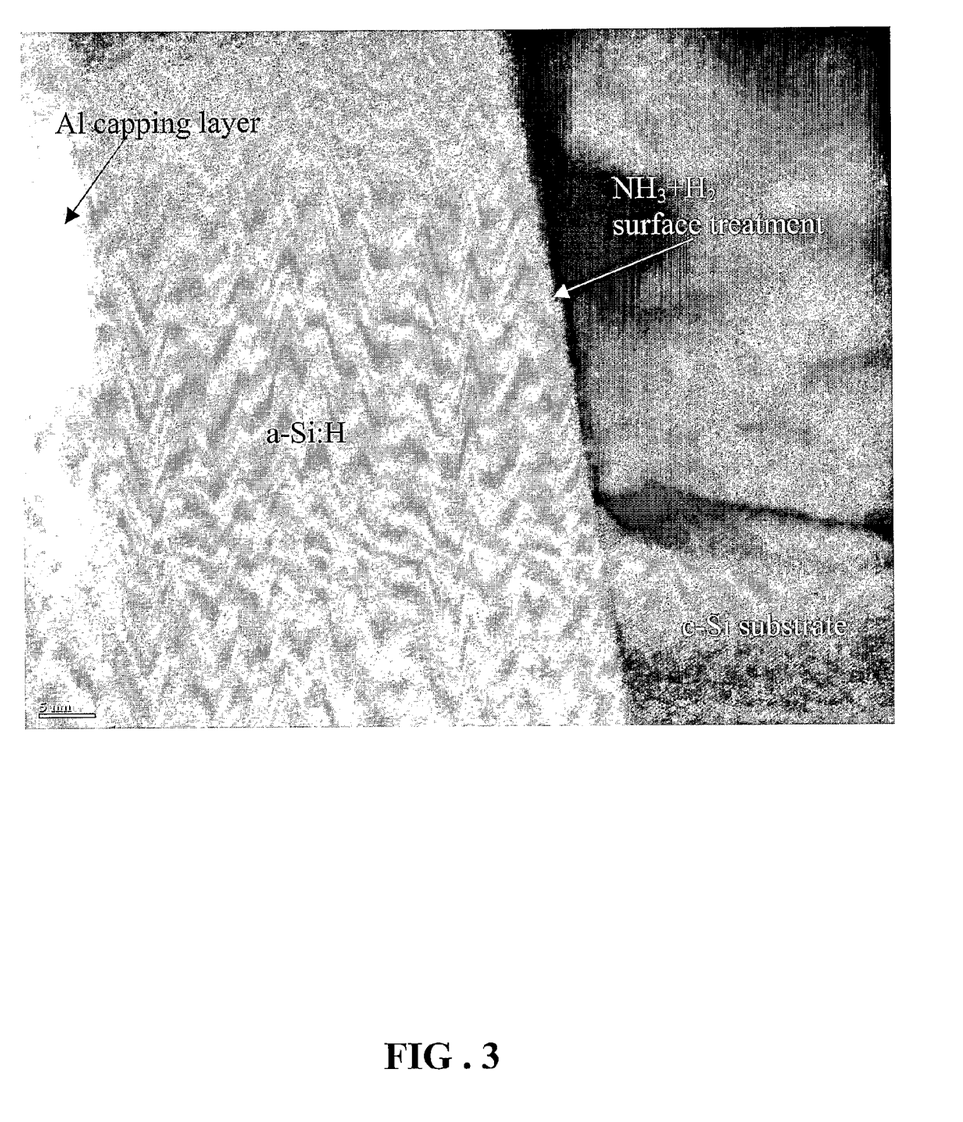
FIG. 3 is a TEM picture showing treatment of the surface of a c-Si substrate with a process gas of $NH_3/H_2$ prior to deposition of an a-Si:H layer by HWCVD to immediately grow a layer of a-Si:H without producing an intermediate layer.

FIG. 3 is a TEM picture showing treatment of the surface of a c-Si substrate with a process gas of $NH_3/H_2$ prior to deposition of an a-Si:H layer by HWCVD immediately grows a layer of a-Si:H without producing an intermediate layer.

Figure 4:
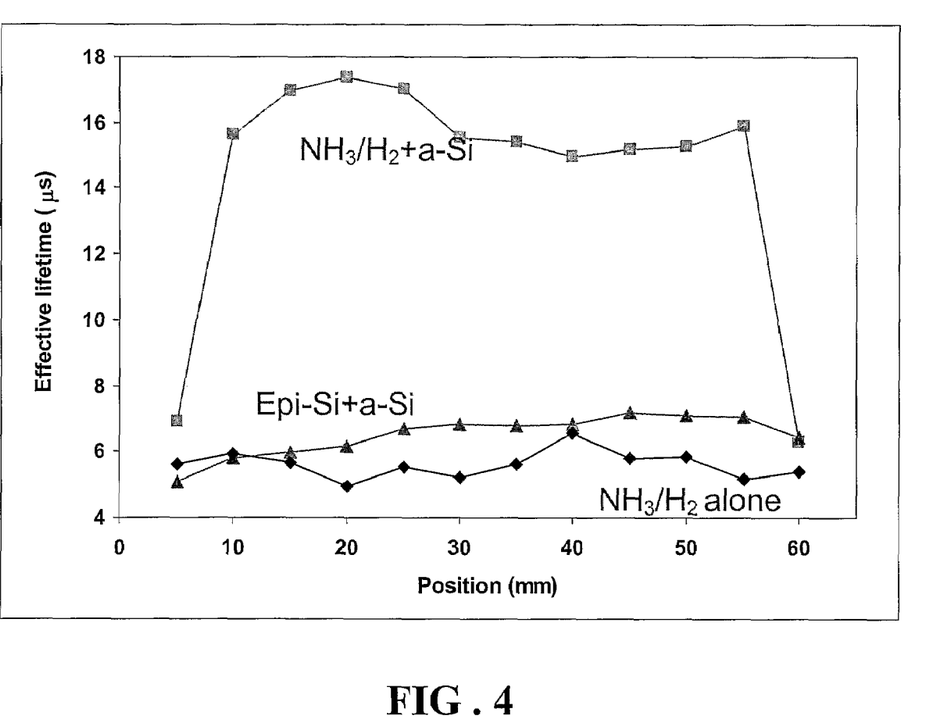
FIG. 4 shows that the sharp transition from c-Si to a-Si:H in FIG. 3 leads to an improvement of minority carrier lifetime.

The sharp transition from c-Si to a-Si:H of FIG. 3 leads to improvement of minority carrier lifetime, as shown in the graph of FIG. 4 for device performance.

The graph of FIG. 4 shows that the a-Si on the c-Si cell obtained by first heating the c-Si with a flowing gas of $NH_3/H_2$ followed by depositing a-Si:H improves the lifetime of the c-Si-based solar cell, per the data line with the squares.

Figure 1:
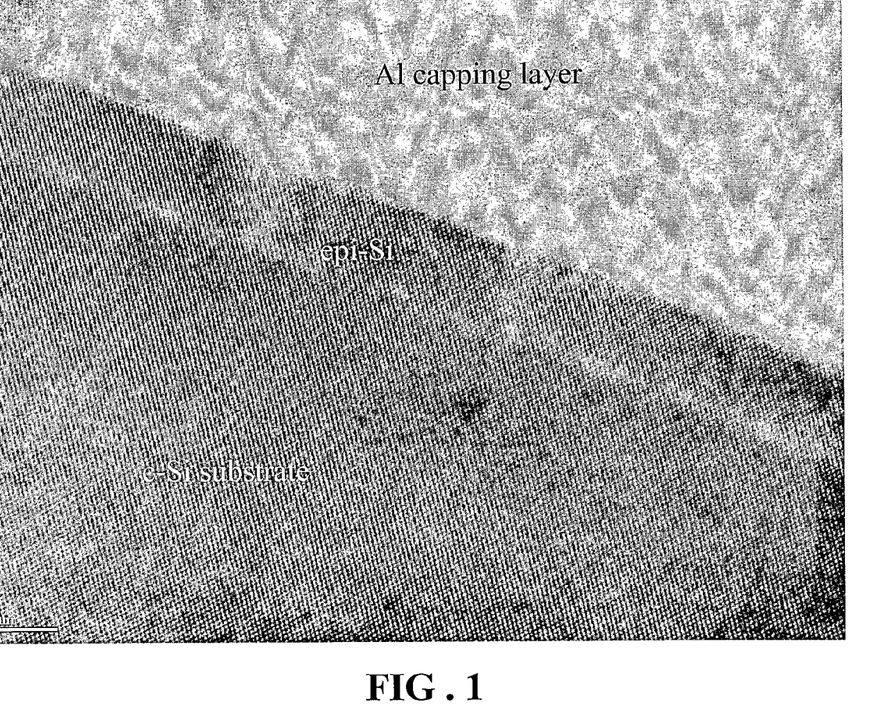
FIG. 1 shows a typical epi-Si growth or deposition on a c-Si substrate in a normal hotwire CVD deposition, where full epitaxial growth is obtained, and in which the c-Si surfaces are not passivated well.

When one measures minority-carrier lifetime on a silicon substrate of finite thickness (~400 microns in this case), the apparent lifetime value is a function of surface states. If the surfaces are not passivated so that a lot of silicon atoms on the surfaces have unsatisfied dangling bonds, the surfaces act as very effective recombination centers for the charge carriers and reduce the apparent lifetime to a value much lower than its true bulk lifetime. The data points in FIG. 4 show that using direct deposition of "a-Si" (it is actually epitaxial c-Si as shown in FIGS. 1 & 2) is not effective in passivating the c-Si substrate surface (the triangles), whereas using a short $NH_3+H_2$ treatment just prior to HWCVD deposition resulted in immediate and true aSi layer deposition on the c-Si surface and measured lifetime value is much higher (even though the deposition was done on one side of the substrate only, leaving the other side still unpassivated). The lifetime measurements were done on one piece of c-Si wafer but processed differently: half with $NH_3/H_2$ treatment and the other half without treatment. The x-axis position was sampled at various positions on the c-Si wafer.

The advantage of the invention process is that: (1) $NH_3+H_2$ treatment before HWCVD deposition of thin film silicon leads to an immediate and true a-Si:H layer on a c-Si surface; (2) the immediate and true a-Si:H layer deposition on c-Si substrates have superior passivation properties of c-Si dangling bonds; (3) this process can be employed in a-Si/c-Si heterojunction solar cells by significantly reducing junction interface recombination and back surface recombination; (4) this process can be used in a c-Si homojunction solar cells by passivating either or both the front and back surface to improve its energy conversion efficiency; and 5) this process can also be used as an important surface treatment before the growth of a few nanometer high-k dielectrics such as SiNx and others, in CMOS devices because of the well-defined interface.

Figure 5A:
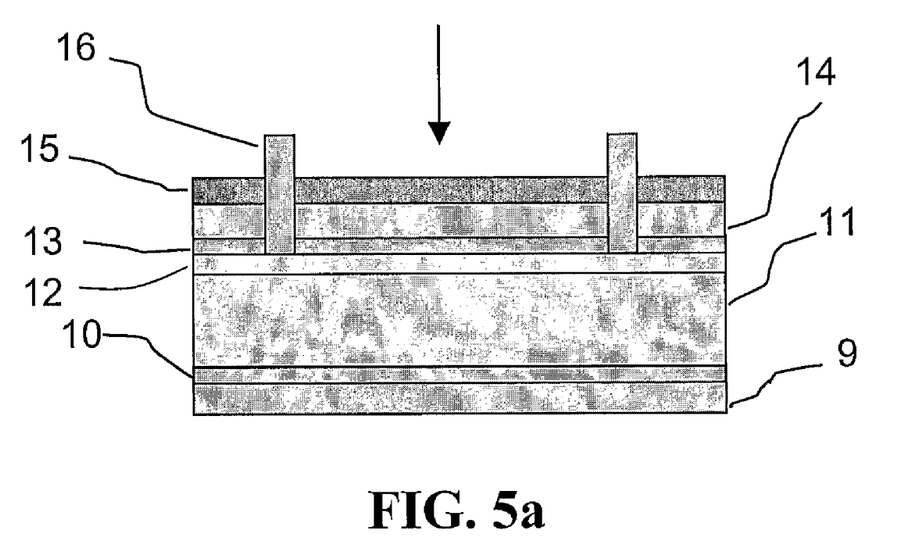
in FIG. 5a there is a top surface passivation layer in a diffused-junction silicon solar cell.

A schematic illustration of the diffused junction c-Si cell of FIG. 5a is a typical application of the cell resulting from the invention process. The cell comprises a back-contact metal layer 10, a back-contact interfacial layer 11, a c-Si substrate layer 12, a buffer layer 13 formed from the $NH_3+H_2$ treatment, an a-Si layer 14, a transparent conductive oxide layer 15, and a front contact metal grid 16. The arrow represents impinging sunlight.

Figure 5B:
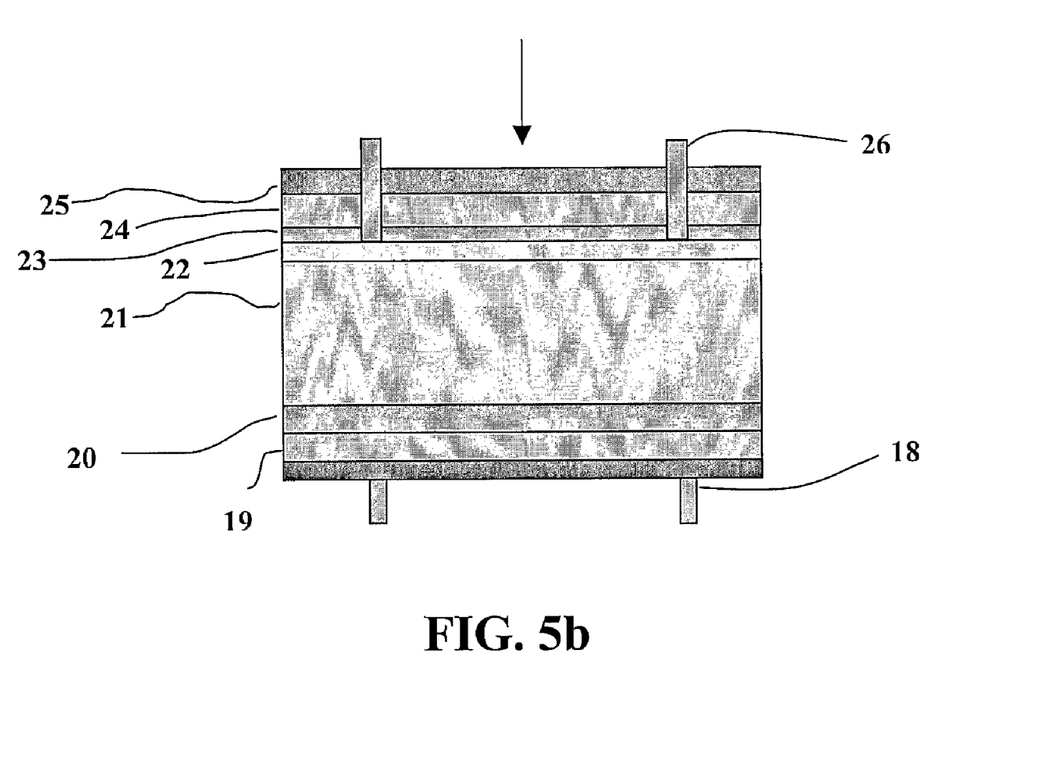
in FIG. 5b there is both top and bottom surface passivation layers in a diffused-junction silicon solar cell; and in FIG. 5c a heterojunction silicon solar cell with emitter and passivation layer on the top surface, and both the back-surface field, and a passivation layer on the bottom surface.

The schematic illustration of FIG. 5b shows the application of the invention process to prepare a diffused-junction silicon solar cell in which both the top and bottom surface passivation layer is incorporated into the diffused-junction silicon solar cell. The cell comprises a back contact metal layer 20 treated with $NH_3+H_2$ to form an $NH_3+H_2$ a-Si layer 21, a c-Si(p) layer 22, a front contact metal grid ARC layer 23, a a-Si layer 24 deposited after the $NH_3+H_2$ treatment 25.

Figure 5C:
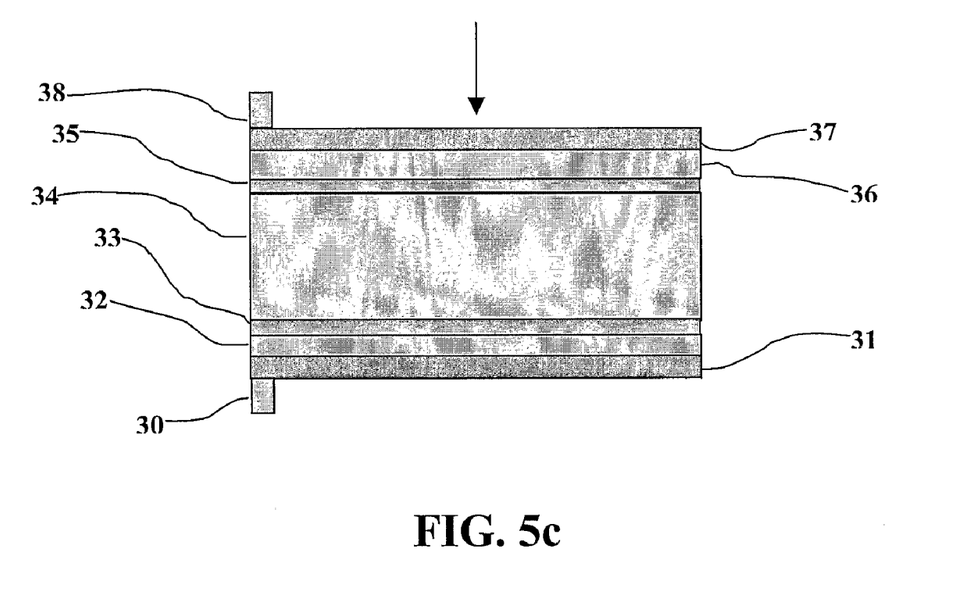

In FIG. 5c the illustration shows both the emitter and passivation layer on the top surface and, as both the back-surface-field and a passivation layer on the bottom surface in a heterojunction silicon solar cell. More particularly, there is shown a back-contact metal layer 30 on which there is a transparent conductive oxide layer 31, and a-Si back-surface-field layer 32 formed after treatment with $NH_3+H_2$ layer 33, a c-Si layer or substrate 34 on which there is a treatment layer 35 formed from $NH_3+H_2$, an a-Si emitter layer 36, a transparent conductive oxide layer 37, and a front contact metal grid 38.

While the invention has been described with regard to specific embodiments, it is not limited thereto, and various modifications will be apparent to those skilled in the art and such modifications are deemed to fall within the spirit and scope of the invention, which is limited only by the claims.

The invention claimed is:

1. In a method of making a c-Si-based cell, the improvement of increasing the minority charge carrier's lifetime, comprising:
   a) placing a c-Si or polysilicon wafer into a CVD reaction chamber under a low vacuum condition and subjecting the substrate of said wafer to heating; and
   b) passing mixing gases comprising $NH_3$ and $H_2$ through said reaction chamber at a low vacuum pressure for a sufficient time and at a sufficient flow rate to enable growth of an a-Si:H layer sufficient to increase the minority charge carrier lifetime of said c-Si polysilicon cell beyond that of growth of an a-Si:H layer without treatment of said wafer with $NH_3$ and $H_2$; and
   c) flowing $SiH_4$ over said wafer.

2. The method of claim 1 wherein in step a) said low vacuum condition is a pressure of about $10^{-6}$ Torr.

3. The method of claim 2 wherein said heating of said wafer substrate is to a temperature of about 250° C.

4. The method of claim 3 wherein in step b) said low vacuum pressure is about 20 mTorr.

5. The method of claim 4 wherein the flow rate of $NH_3$ is in a range of from about 2 to about 10 sccm and the flow rate of $H_2$ is in a range of from about 0 to about 50 sccm.

6. In a method of making a μc-Si-based cell, the improvement of increasing the minority charge carrier's lifetime, comprising:
   a) placing a μc-Si wafer into a CVD reaction chamber under a low vacuum condition and subjecting the substrate of said wafer to heating; and
   b) passing mixing gases comprising $NH_3$ and $H_2$ through said reaction chamber at a low vacuum pressure for a sufficient time and at a sufficient flow rate to enable growth of an a-Si:H layer sufficient to increase the minority charge carrier lifetime of said μc-Si cell beyond that of growth of an a-Si:H layer without treatment of said wafer with $NH_3$ and $H_2$.

7. The method of claim 6 wherein in step a) said low vacuum condition is a pressure of about $10^{-6}$ Torr.

8. The method of claim 7 wherein said heating of said wafer substrate is to a temperature of about 250° C.

9. The method of claim 8 wherein in step b) said low vacuum pressure is about 20 mTorr.

10. The method of claim 9 wherein the flow rate of $NH_3$ is in a range of from about 2 to about 10 sccm and the flow rate of $H_2$ is in a range of from about 0 to about 50 sccm.

11. A diffuse-junction silicon solar cell characterized by improved charge carrier lifetime comprising a c-Si or polysilicon wafer with a top surface passivation layer of a-Si:H grown using $SiH_4$ after treatment of said c-Si or polysilicon wafer with a mixture of $NH_3$ and $H_2$.

12. A diffuse-junction silicon solar cell characterized by improved charge carrier lifetime comprising a μc-Si wafer with a top surface passivation layer of a-Si:H grown using $SiH_4$ after treatment of said μc-Si wafer with a mixture of $NH_3$ and $H_2$.

* * * * *